US009714463B2

(12) United States Patent
White et al.

(10) Patent No.: US 9,714,463 B2
(45) Date of Patent: Jul. 25, 2017

(54) COATINGS FOR ELECTROWETTING AND ELECTROFLUIDIC DEVICES

(71) Applicant: GVD Corporation, Cambridge, MA (US)

(72) Inventors: Aleksandr J. White, Arlington, MA (US); W. Shannan O'Shaughnessy, Cambridge, MA (US); Erik S. Handy, Malden, MA (US); Hilton G. Pryce Lewis, Lexington, MA (US); Karen K. Gleason, Cambridge, MA (US)

(73) Assignee: GVD Corporation, Cambridge, MA (US)

( * ) Notice: Subject to any disclaimer, the term of this patent is extended or adjusted under 35 U.S.C. 154(b) by 359 days.

(21) Appl. No.: 13/729,655

(22) Filed: Dec. 28, 2012

(65) Prior Publication Data

US 2013/0171546 A1    Jul. 4, 2013

Related U.S. Application Data

(60) Provisional application No. 61/581,770, filed on Dec. 30, 2011.

(51) Int. Cl.
| | |
|---|---|
| *C08F 2/46* | (2006.01) |
| *C23C 16/30* | (2006.01) |
| *C23C 16/02* | (2006.01) |
| *C23C 16/50* | (2006.01) |
| *C25B 9/00* | (2006.01) |
| *B05D 1/00* | (2006.01) |

(52) U.S. Cl.
CPC .............. *C23C 16/30* (2013.01); *B05D 1/60* (2013.01); *C23C 16/02* (2013.01); *C23C 16/50* (2013.01); *C25B 9/00* (2013.01)

(58) Field of Classification Search
CPC ......... C23C 16/30; C23C 16/02; C23C 16/50; C25B 9/00; B05D 1/60
USPC ........................................................ 427/487
See application file for complete search history.

(56) References Cited

U.S. PATENT DOCUMENTS

| 7,791,815 B2 * | 9/2010 | Weikart ................... G02B 3/14 359/666 |
| 2007/0177276 A1 * | 8/2007 | Liogier D'ardhuy ............ G02B 26/005 359/666 |
| 2012/0276334 A1 * | 11/2012 | Fedynyshyn ............ B05D 5/04 428/141 |

FOREIGN PATENT DOCUMENTS

| EP | 2143818 | 1/2010 |
| WO | 03038143 | 5/2003 |
| WO | 04001832 | 12/2003 |

OTHER PUBLICATIONS

Van Aken et al. "Inline Processed Flexible Thin Film Silicon Solar Cells Using Linear PECVD Sources" 25th European Photovoltaic Solar Energy Conference and Exhibition 5th World Conference on Photovoltaic Energy Conversion Sep. 2010.*
Mao et al. "Hot Filament Chemical Vapor Deposition of Poly(glycidyl methacrylate) Thin Films Using tert-Butyl Peroxide as an Initiator" Langmuir 2004, 20, 2484-2488.*
Gleason et al. "Polymer Nanocoatings by Initiated Chemical Vapor Deposition (iCVD)" NSTI-Nanotech 2005, vol. 2, 310-312.*
Blickenstaff et al. "Techniques for Shadow Mask Deposition of Non-planar Dielectric Layers" Lasers and Electro-Optics Society, LEOS 2003, The 16th Annual Meeting of the IEEE 700-701.*
Zdyrko et al. "Universal Platform for Surface Modification Employing Grafted Polymer Layers" Material Matters 2008, 3.2, 44, pp. 1-7.*
Fan et al. "Electrowetting on Polymer Dispersed Liquid Crystal" Applied Physics Letters 94, (2009) 164109-1-164109-3.*
Chang et al. "An Electrowetting-Based Microfluidic Platform for Magnetic Bioassays" 14$^{th}$ International Conference on Miniaturized Systems for Chemistry and Life Sciences Oct. 2010, pp. 1331-1333.*
Fourmond et al. "Impact of Ammonia Pretreatment of the Silicon Surface Prior to the Deposition of Silicon Nitride Layer by PECVD" 23$^{rd}$ European Photovoltaic Solar Energy Conference and Exhibition Sep. 2008.*
Narrainen et al. "Novel Multi End-Functionalized Polymers. Additivesto Modify Polymer Properties at Surfaces and Interfaces" Soft Matter, 2006, 2, 126-128.*
Anand, "Enhanced condensation on lubricant-impregnated nanotextured surfaces", ACS Nano, 6(11):20122-9 (2012).
Bayiati, et al., "Selective plasma-induced deposition of fluorocarbon films on metal surfaces for actuation in microfluidics", J Vac. Sci. Technol., 22(4):1546-51 (2004).
Dhindsa, et al., "Reliable and low-voltage electrowetting on thin parylene films", Thin Solid Films, 519(10):3346-51(2011).

(Continued)

*Primary Examiner* — Robert S Walters, Jr.
(74) *Attorney, Agent, or Firm* — Pabst Patent Group LLP

(57) ABSTRACT

Electrowetting devices coated with one or more polymeric layers and methods of making and using thereof are described herein. The coatings may be formed in a single layer or as multiple layers. In one embodiment the first layer deposited serves as an insulating layer of high dielectric strength while the second layer deposited serves as a hydrophobic layer of low surface energy. These materials may themselves be deposited as multiple layers to eliminate pinhole defects and maximize device yield. In one embodiment the insulating layer would be a vapor deposited silicone polymeric material including, but not limited to, polytrivinyltrimethylcyclotrisiloxane or polyHVDS. In another embodiment the insulating layer may be a vapor deposited ceramic such as SiO$_2$ with very little carbon content. In a further embodiment the insulating layer may be composed of alternating layers of a siloxane material and a ceramic material.

21 Claims, No Drawings

(56) References Cited

OTHER PUBLICATIONS

Heikenfeld, et al., "Review Paper: a critical review of the present and future prospects for electronic paper", J of the SID, 19(2):129-56 (2011).
Kahouli, et al., "Structural and dielectric study of parylene C thin films", J. Legrand Appl. Phys. Lett., 94:152901-3 (2009).
Mugele and Baret, "Electrowetting: from basics to applications", J. of Phys. Cond. Matter, 17:R705-R774 (2005a).
Mugele, et al., "Electrowetting: A convenient way to switchable wettability patterns", J. Phys. Cond. Matt., 17:S559 (2005b).
Raj, et al., "Ion and Liquid Dependent Dielectric Failure in Electrowetting Systems", Langmuir, 25(20): 12387-92 (2009).
Smith, et al., "Droplet mobility on lubricant-impregnated surfaces", Soft Matter, 9:1772-80 (2013).
Wong, et al., "Bioinspired self-repairing slippery surfaces with pressure-stable omniphobicity", Naure,477:433-47 (2011).
Zhou, et al., "A full description of a simple and scalable fabrication process for electrowetting display", J. Micromech. Microeng., 19(065029):1-12 (2009).
International Search Report and Written Opinion for corresponding PCT Application PCT/US2012/071969 mailed Sep. 6, 2013.

\* cited by examiner

COATINGS FOR ELECTROWETTING AND ELECTROFLUIDIC DEVICES

FIELD OF THE INVENTION

This invention is in the field of coated electrowetting and electrofluidic devices, particular devices coated by chemical vapor deposition, and methods of making and using thereof.

BACKGROUND OF THE INVENTION

The beneficial physical properties of pyrolytic (also called hot-wire or hot-filament) and pyrolytic initiated chemical vapor deposited polymer coatings makes them suitable for a variety of applications.

Current strategies for hydrophobic dielectric polymeric coatings for electrowetting devices are mainly liquid-based protocols that rely on applying a polymer coating solution onto the surface of a substrate with the subsequent removal of the solvent. Coatings applied from the liquid phase, such as fluorinated compounds, silicones, acrylics, urethanes, and potting compounds, are difficult to deposit at the required thickness and can exhibit pinholes and thickness non-uniformity based on wetting effect. Electrowetting devices, however, can handle neither the required weight nor thickness of these coatings nor allow for uneven coverage of high aspect ratio areas of their assemblies.

There are few existing vapor phase approaches to coating electrowetting devices and those that are used possess major drawbacks. The use of parylene (poly(p-xylene)) homopolymeric coatings as the electrically insulating material is one commercialized approach. While the bulk material possesses reasonable dielectric properties, parylene suffers from major issues related to substrate adhesion, especially on substrates composed of multiple materials which are difficult to prime for deposition. As no polymer is truly hermetic, even the best polymer barriers allow some water vapor through. These water molecules compete with molecular segments of polymer encapsulant for device surface sites. Poor adhesion to the substrate permits water vapor to condense at substrate surface sites where parylene polymer segments are poorly adhered. Overtime, these aqueous films subject the device to substantial risk of device failure.

For example, despite parylene's lower water vapor permeability, a 1.5 μm/1 μm bilayer pyrolytic CVD film significantly outperforms parylene coatings during surface insulation resistance testing with interdigitated electrodes used as the test vehicle. This suggests that low water vapor permeability is not the critical parameter in protecting device surface circuitry. Indeed, the critical function of encapsulant coatings is its ability to inhibit aqueous film formation at the surface.

Parylene also possesses significant issues with respect to UV stability. Most parylene compositions display damage due to UV irradiation, including clouding, cracking, and flaking, within 1000 hours of use. Typical design life for many display applications runs in the 25,000-100,000 hour range, meaning that for most of the life of the device, environmental protection may be compromised along with device function (due to decrease light output through a non-transparent barrier layer). Many pyrolytic CVD materials do not possess this issue, such as pyrolytic CVD deposited polytetrafluoroethylene (PTFE) which is transparent in the UV range and consequently entirely unaffected by environmental UV irradiation.

There no currently commercialized vapor deposition approaches for the formation of a material having a lower surface energy than Parylene or variants thereof. Lower surface energy materials are necessary for many electrowetting device applications.

Electrowetting describes the electromechanical reduction of a liquid's contact angle as it sits on an electrically-charged solid surface. As described above, when an electric field is applied across the interface between a solid and a water droplet, the surface tension of the interface is changed, resulting in a change in the droplet's contact angle. In oil ambient (i.e., when the water droplet is surrounded by oil rather than air), the electrowetting effect can provide >100° of reversible contact angle change with fast velocities (>10 cm/s) and low electrical energy (~100 to 102 mJ/m$^2$ per switch). Electrowetting has become one of the most widely used tools for manipulating tiny amounts of fluids on surfaces. A large number of applications based on electrowetting have now been demonstrated, including lab-on-a-chip devices, optics, and displays.

An important parameter in electrowetting studies is Young's angle (θY), defined as follows:

$$\cos\theta Y = (\gamma od - \gamma ad)/\gamma ao \quad (1)$$

where; γod is the interfacial tension between the electrowetting liquid (a, typically aqueous) and the oil (o) surrounding the electrowetted liquid; γad is the interfacial tension between (a) and the dielectric layer (d); and γao is the interfacial tension between (a) and (o).

For most electrowetting applications, it is generally desirable to use low voltages (V) to switch from Young's angle to the electrowetted contact angle (θV). Low-voltage operation is particularly important for particular displays, such as e-paper displays, that require very large arrays (thousands or millions) of electrodes. These devices require active-matrix electrode control. Active matrix control makes use of thin film transistors (TFTs) that independently address each of the pixel states. TFTs typically provide reliable operation up to about only 15V. However, achieving reliable electrowetting devices operating at ≤15V has been a considerable challenge.

In an electrowetting system, Young's angle is reduced to the electrowetted contact angle (θV) as predicted by the electrowetting equation, $$\cos\theta V = (\gamma od - \gamma ad)/\gamma ao + \in V2/(2d\gamma ao) \quad (2)$$

where: ∈ is the dielectric constant and d is the thickness of the dielectric; γ is used for terms denoting the interfacial tension between the electrowetting liquid, the oil, and the dielectric, as described in equation 1, above; and V is the applied DC or AC RMS voltage.

Once surface tensions are optimized for a high Young's angle (θY), the electrowetting equation predicts that lower voltages may be obtained only by reducing the thickness of the dielectric, or by using a dielectric with a higher dielectric constant. A change in contact angle on the order of 100 degrees is desirable for good electrowetting device function.

The use of high dielectric constant layers, however, has no effect in real-world studies. When such dielectrics are combined with a conventional fluoropolymer top coat, the increased capacitance is substantially masked by the low dielectric constant fluoropolymer. Further, increased capacitance in the dielectric layer results in electric field amplification in the top coat, which can lead to a higher likelihood of charging effects within the topcoat. Some high dielectric constant materials also show excessive leakage currents (due to unwanted electronic carrier injection and transport) when employed in electrowetting systems. It should be noted that most polymeric materials have dielectric constants between 2 and 3, making variation of this parameter even less useful for tuning electrowetting behavior.

Reducing the thickness of the dielectric layer instead (e.g., to the submicron range) has also proven to be a considerable challenge. First, as the dielectric thickness is reduced for a given voltage and target γao value, the magnitude of the applied electric field across the dielectric increases. As such, the probability of charging effects (e.g., ion diffusion into and entrainment within the dielectric) and dielectric breakdown also increases. Furthermore, as the thickness of the dielectric layer decreases, the thickness can eventually match the depth of voids and pin-holes within the dielectric layer. Such defects typically result in immediate dielectric failure when voltage is applied. In this regard, dielectric failure modes for electrowetting are perhaps more complicated than those of purely solid-state systems. That is, under an applied field, the conductive aqueous solution in electrowetting devices is capable of propagating through porous networks within the dielectric. The onset of electrolysis occurs when migrating aqueous solutions reach the electrode, degrading the electrowetting response and progressively destroying the electrowetting surface.

To date, electrowetting products have made use of thick dielectric layers. For example, the first commercial electrowetting products were higher voltage 30-60V, variable-focus electrowetting lenses (Varioptic SA), where thicker (~3-5 um) parylene dielectrics were utilized. Electrowetting displays also presently use parylene as the dielectric and currently achieve 20V operation, but the operating voltage must decrease further to comply with the needs of conventional TFTs.

Poly (2-chloro-paraxylylene) (trade name Parylene C) is presently the material of choice for optoelectronic electrowetting systems. It is a vapor-deposited conformal dielectric that is commonly employed to provide environmental protection in the microelectronics and medical device industries. Its electrical insulation properties and resistance to water permeation has made parylene one of the most extensively used dielectrics in electrowetting systems (e.g., in Varioptic's liquid lenses). However, because of the onset of leakage current for Parylene C at thicknesses of <1-2 μm, it is not possible to obtain a thin, high-capacitance parylene-C layer for low voltage operation. The failure of parylene to provide adequate insulation at lower thicknesses is attributed to the presence of defects such as voids and pinholes that disappear or are masked when parylene is deposited to greater thicknesses. Further, the long-term hydrolytic stability of parylene C is in question. For example, parylene has been shown to undergo hydrolysis with resultant craze cracking upon exposure to high humidity.

As an alternative to polymeric dielectrics, 100-nanometer-thick inorganic oxide (e.g., $Al_2O_3$) films formed using atomic layer deposition (ALD) have shown reliable low voltage (<15V) operation. However, the prohibitive cost of ALD (which is in part due to its very low deposition rates) precludes this option, particularly for larger scale commercial manufacture. In addition, ALD coatings typically require higher deposition temperatures (e.g., 250° C.) that may not be tolerated by some substrate materials. It has been suggested that electric failure could be the foremost issue in long-term reliability for low-voltage electrowetting devices. In addition, these layers are not flexible and therefore do not lend themselves for many embodiments envisioned for electrowetting devices, especially flexible displays and e-paper devices.

A second materials challenge for electrowetting devices lies with the hydrophobic top layer. Hydrophobicity is required to achieve high contact angle modulation. Thus, in typical electrowetting devices, the dielectric layer is overcoated with a thin hydrophobic layer. The hydrophobic topcoat in conventional electrowetting displays is a wet-applied film consisting of a fluoropolymer in a solvent or suspension. Fluoropolymers are known for their exceptional insulating properties. However, wet-applied fluoropolymers have proven to be inadequate for most electrowetting applications. Specifically, wet-applied fluoropolymers do not densify well and can exhibit porous networks that lead to electrical breakdown. This characteristic precludes the dual use of conventional fluoropolymers as the hydrophobic layer and the dielectric layer. Thus, to date, fluoropolymers have typically been used only to impart hydrophobicity. The wet-applied fluoropolymer layer (e.g., Fluoropel) is spin- or dip-coated onto the dielectric layer and subsequently dried and annealed. Dewetting and surface tension effects associated with deposition of these wet-applied coatings can result in poor thickness uniformity and poor conformality to the substrate geometry. This leads to inconsistent contact angle modulation between display pixels. Further, the high temperature annealing step (often at temperatures ≥180° C.) required for many wet-applied fluorocarbon films is incompatible with many substrate materials, especially those proposed for some displays. In particular, the annealing step can deteriorate the dielectric properties of parylene-C (which has a continuous use temperature of only 80° C.). Substrates used in some electrofluidic devices contain fine micro cavities that may be easily plugged by wet-applied coatings.

Finally, for electrowetting applications, the thickness of the top hydrophobic layer must be kept low to (1) minimize the applied voltage needed for contact angle modulation, and (2) to mitigate the potential for charges to be trapped within the top coat. Wet-applied coatings are typically not capable of being applied at less than 30-50 nm thick.

There exists a need for uniformly-deposited hydrophobic layers and thin, non-porous dielectric layers that overcome the limitations described above. Ideally, a single coating technique would be used for deposition of both layers. This would simplify and reduce the cost of device manufacturing. Using vapor deposition for both layers would help ensure coating conformality, uniformity, and low cost. There is also a need for a vapor deposition technique that, unlike ALD coatings, can produce high-integrity coatings at a reasonable rate without damaging the underlying substrate being coated.

Therefore, it is an object of the invention to provide uniformly-deposited hydrophobic layers and thin, non-porous dielectric layers that overcome the limitations of the prior art and methods of making and using thereof.

SUMMARY OF THE INVENTION

Electrowetting devices coated with one or more polymeric layers and methods of making and using thereof are described herein. The devices are coated at or near room temperature with insulating and low surface energy polymers. This ensures that the substrates are not negatively impacted by the deposition process.

In one embodiment, the electrodes of an electrowetting device are coated with a vapor deposited polymer or polymers. In a further embodiment, the vapor deposited polymers are formed by pyrolytic CVD. They may be formed in a single layer or as multiple layers. In one embodiment the first layer deposited serves as an insulating layer of high dielectric strength while the second layer deposited serves as a hydrophobic layer of low surface energy. These materials may themselves be deposited as multiple layers to eliminate pinhole defects and maximize device yield. In one embodiment the insulating layer would be a vapor deposited silicone polymeric material including, but not limited to, poly-trivinyltrimethylcyclotrisiloxane or polyHVDS. In another embodiment the insulating layer may be a vapor deposited ceramic such as $SiO_2$ with very little carbon content. In a further embodiment the insulating layer may be composed of alternating layers of a siloxane material and a ceramic material. In other embodiments, the device may be coated with a single coating that functions as both the dielectric layer and as the hydrophobic topcoat, such as a fluorinated polymer.

In order to maximize ease of deposition and processing, the coating may be formed of graded composition to optimize both bulk and surface properties without the need for multiple coatings. This may be achieved by varying the composition of feed gas to a pyrolytic CVD reactor throughout deposition. In one embodiment the bulk of the coating would be composed of one or more insulating layers followed by the introduction of a monomer containing one or more hydrophobic moieties which would then provide the required low surface energy to the coating as a copolymer with the insulating underlayer. In a further embodiment, the insulating bulk polymer would be a siloxane containing polymer and the surface of the coating would be a copolymer of the same siloxane and a fluorine containing monomer. In a further embodiment, the insulating polymer would be poly(trivinyltrimethylcyclotrisiloxane) (poly(V3D3)) and the surface material would be a copolymer of V3D3 and a fluorinated acrylate. This same effect can be generated through terminating the bulk chains with a fluorinated molecule at the surface of the coating. In one embodiment the molecule used for termination is perfluorobutane sulfonate (PFBS) and the polymer is polyV3D3.

The flexibility of pyrolytic CVD provides for the use of a wide range of materials in these applications. Possible coating materials for use include, but are not limited to, vinyl siloxanes, PTFE, fluorinated acrylates and methacrylates, divinylsiloxane-bis-benzocyclobutene (DVS-BCB), divinyl benzene, fluoropolymers such as ethylene tetrafluoroethylene (ETFE), fluorinated ethylene propylene, a copolymer of hexafluoropropylene and tetrafluoroethylene (FEP), perfluoroalkoxy vinyl ether (PFA), perfluordecanoic acid (PFDA), and Teflon AF, ceramics including $SiO_2$, and parylenes.

DETAILED DESCRIPTION OF THE INVENTION

I. Definitions

"Electrical bias", as used herein, refers to an electrical potential difference created between the liquid on top of the coating and the substrate beneath the coating. In the current application this electrical potential is used to alter the contact angle of a hydrophilic fluid on the coating surface.

"Energy Source", as used herein, refers to the method of energy input into a gaseous system capable of activating precursor gas species so as to render them capable of forming a coating on the deposition substrate. Example energy sources include, but are not limited to, heated filaments, ionic plasma excitation, gamma irradiation, ultraviolet irradiation, infrared irradiation, and electron beam excitation.

"Filament", as used herein, refers to resistively heated lengths of material capable of one or more of the following: thermal excitation of precursor gases, evaporative transfer of metal to the deposition substrate, or convective or radiative heating of the substrate.

"Gradient polymer coating", as used herein, refers to deposited coating(s) in which one or more physical, chemical, or mechanical properties vary over the deposition thickness. Variation may be continuous or step-wise without limit to the number of steps or changes in different properties.

"Inert Gas", as used herein, refers to a gas or gases which are not reactive under reaction conditions within the vacuum chamber.

"Vapor-phase coating system", as used herein, refers to any system utilized to deposit a dry coating on a substrate without need for subsequent solvent evaporation or thermal curing. Examples include, but are not limited to, chemical vapor deposition (including atmospheric CVD), atomic layer deposition, and physical vapor deposition.

"Water contact angle", as used herein, refers to the angle of incidence of a water droplet in air on the surface of a material. In one embodiment, the water contact angle is measured by a goniometer using the sessile drop technique. In another embodiment, the "receding water contact angle" is measured as the volume of a water droplet on a surface decreases with time.

The term "conductive polymer" as used herein can refer to polymers which are intrinsically electrically-conductive, and which do not require incorporation of electrically-conductive additives (e.g., carbon black, carbon nanotubes, metal flake, etc.) to support substantial conductivity of electronic charge carriers. Charge carriers believed to be responsible for electrical conductivity in conductive polymers include polarons, bipolarons, and solitons. It may also refer to a conjugated polymer system which, if properly doped, would be conductive regardless of current doping state.

The term "gaseous polymerizable species", as used herein, refers to species which can be generated in the gas phase and upon polymerization form a conducting polymer. The term "gaseous polymerizable species" includes monomers, oligomers, and metal-organic compounds. The gaseous polymerizable species disclosed herein may not necessarily be gases at room temperature and atmospheric pressure. If such species are liquids or solids, for example, they may be evaporated at reduced pressure or heated or both in order to perform the methods described herein.

The term "oligomer" as used herein may refer to structures having more than one fundamental repeating unit, such as a dimer, trimer, tetramer, pentamer, hexamer, etc., but not a "monomer" (which may have only one fundamental unit).

"End-capped polymer coating", as used herein, refers to a polymer coating containing polymer chains originating and/or terminated in, or with, a specific chemical moiety. The polymers can be capped to modify the physical and/or chemical properties of the polymer chains. The polymer chains may be linear or branched.

"Insulation" or "Insulating", as used herein, means a material exhibiting a resistivity of $>10^{-14}$, $>10^{-15}$, or $>10^{-16}$ Ohm-cm, with a dielectric breakdown strength of >5,000, >6,000, or >7,000 Volts/mil.

"Low surface energy", as used herein, means a material with a critical surface tension <30, 25, 20, 19, 18, 17, 16, 15, 14, 13, 12, 11, or 10 dyn/cm.

"Hydrophobic", as used herein, means a material with a static contact angle with deionized water in air of >90°, 95°, 100°, 105°, 110°, 115°, or 120°.

II. Methods for Preparing Electrowetting and Electrofluidic Devices Coated with CVD-Applied Coatings Electrowetting and electrofluidic devices coated with materials deposited using CVD techniques and methods of making and using are described herein.

Suitable CVD techniques include, but are not limited to, initiated chemical vapor deposition (iCVD), pyrolytic CVD, and plasma CVD. Using CVD techniques, the coating can be deposited in a continuously or semi-continuously on the substrate. The substrate can be individual articles to be coated or can be a continuous substrate, such as a flexible material. The flexible material can be spooled between two rolls. It is preferable that the material to be deposited provides insulation and/or low surface energy to the electrowetting or electrofluidic device or assembly. The coating material can be polymeric, such as a homopolymers, copolymer, or terpolymer; metallic materials, such as metals and metal oxides, ceramics, or combinations thereof. The material to be deposited can be applied in multiple layers to prevent coating defects. For those embodiments where the deposited material is polymeric, processing steps can be applied resulting in a higher molecular weight of the vapor deposited polymer.

In one embodiment, the one or more of the coatings deposited on the device or assembly is an amorphous fluoropolymer, such as PTFE. In some embodiments, the amorphous fluoropolymer layer is backfilled with another vapor-deposited polymer, such as siloxanes, acrylates, or parylene-based films.

In still other embodiments, the coating is comprised of multiple layers, not all of which are applied by vapor deposition. In some embodiments, one of the layers is a liquid applied crystal polymer layer and the one or more additional layers are applied by vapor deposition.

In still other embodiments, the surface coating is a hydrophobic surface coating which is a composite of a hydrophobic vapor deposited polymer and a hard filler material such as clay particles or diamond particles.

A. Initiated Chemical Vapor Deposition (iCVD)

In some embodiments, the coatings are applied using initiated chemical vapor deposition (iCVD). Initiated CVD (iCVD) is a variation of hot filament chemical vapor deposition and is a one-step, solvent-free process. The iCVD mechanism closely resembles free radical polymerization and preserves the important organic functional groups of the monomeric reactant. In iCVD, a gas (e.g., commercially-available hexafluoropropylene oxide) or mixture of gases is introduced into a reactor under mild vacuum in the vicinity of an array of heated filament wires. The gas decomposes into reactive species—radicals—that serve as monomer units. These units then migrate to a cold surface, e.g., the electrowetting device electrode surface, on which they combine and grow into a conformal polymer thin film. The monomer units successively add to one another, forming a linear chain having the precise chemical makeup of the polymer.

The low operating pressures of an iCVD process, typically in the 10-100 Pa (75-750 mTorr) range, allow conformal coating of extremely fine objects such as particles. "Conformal", as used herein, generally means that the features of the object being coated, such as angles, scale, etc. are preserved. Indeed, uniform "shrink-wrapping" of geometries as small as carbon nanotubes (40 nm PTFE coating) has been demonstrated.

CVD reactants and reactor designs can be chosen such that selective chemical pathways are followed under conditions of low filament temperature and low energy input (5-400 Watts). No electrical excitation of the gas is required, and film growth proceeds via conventional polymerization pathways. iCVD coating thicknesses in the 25 nm to 10 μm range are typical, and deposition rates of up to 100 nm/minute or more are achievable.

In the iCVD process, the substrates being coated typically remain at or near room temperature. In contrast, wet spray-on versions of hydrophobic fluoropolymers, such as DuPont's PTFE-based Teflon® containing pre-polymerized PTFE particles, have to be sintered together at >315° C. before use. Such temperatures are considerably higher than the recommended use temperatures for many substrate materials, such as E-paper substrates. In some embodiments, the substrate to be coated is heated to a temperature above room temperature, such as 35° C., 50° C., 75° C., 100° C., or 150° C. In other embodiments, the substrate is maintained at a temperature less than room temperature, such as 20° C., 15° C., 10° C., 5° C., 0° C., −5° C., −10° C., or −25° C. In still other embodiments, the substrate to be coated is maintain at approximately room temperature, e.g., 20° C. to 35° C., more preferably from about 25° C. to about 30° C.

Wet-applied fluorinated hydrophobic coatings also contain harmful surfactants and are difficult to deposit uniformly. Unlike conventional wet-applied coatings, coatings deposited using iCVD are immediately ready to use after deposition, contain no surfactants, and require no post-processing (i.e., no high temperature drying or annealing). However, post-processing steps to modify surface morphology or surface chemistry can be applied for a particular application.

One advantage of using pyrolytic CVD to prepare electrowetting devices is the ability to make ultrathin pinhole-free coatings. This has significant advantages in the construction of electrowetting devices as it reduces the voltage requirements for switching by reducing the coating thickness required for device insulation. This goal is central to integrating electrowetting devices within current display or electronics platforms by allowing them to be driven by thin film transistors or even at CMOS voltages.

CVD can also be utilized for the deposition of the electrode layer through oxidative CVD of a conjugated monomer for the formation of an intrinsically conducting polymer. In one embodiment, the conjugated polymer to be applied is poly(3,4-ethylenedioxythiophene (PEDOT). This approach could be utilized to construct transparent devices on paper or other highly temperature sensitive substrates when combined with a suitable barrier material. Surface preparation steps prior to coating may be desirable to maximize the interaction of the coating with the electrode material and eliminate defects or coating delamination issues. Other conducting polymers, such as polythiophenes, polypyroles, polyacetylenes, etc, can also be used.

1. Substrates

CVD-deposited polymers are highly conformal to substrates and allow coating of non-planar materials including fibrous and woven substrates. CVD deposition, especially initiated CVD, is extremely gentle on substrates allowing for them to remain at or near room temperature and avoiding damage due to energetic attack on the substrate common to methods such as plasma CVD. This allows for coating of a wide range of materials including, but not limited to, fibrous substrates, such as textiles and papers, plastics, and membranes, along with all metals, metal oxides, ceramics, glasses and other traditional device substrate materials such as silicon. Textiles may include, woven and non-woven materials (e.g., fibers), electrospun materials, paper, silk, and natural and synthetic cloths. Plastics may include, but are not limited to, polydimethylsiloxane (PDMS), polyethylene terephthalate (PET), polyethylene naphthalebe (PEN), polystyrene (PS), polycarbonates (PC), polyethylene (PE), polytetrafluoroethylene (PTFE), and others.

The substrate can be treated to vary the properties of the substrate and/or to modulate the interactions between the substrate and the coating. For example, in some embodiments, the substrate is treated prior to coating for the purposes of increasing coating adhesion. In particular embodiments, the surface morphology is affected by roughening, polishing, exposure to electron beam, IR radiation, gamma radiation, plasma exposure, thermal treatment, and/or laser exposure.

CVD also has been shown to allow the deposition of highly flexible coatings with still possess extremely stable dielectric properties and are highly resistant to ion ingress. This can allow for construction of electrowetting devices with a wide range of contact liquids and active biases. The devices can operate at elevated temperatures with no additional risk of failure. Surface energy may be tailored through composition and morphology as detailed above. This opens up a large range of possible devices for which this technology can be utilized including, but not limited to: displays, lenses, microfluidics, fiber optics, fluidic control systems, printing, optics, fuel cells, analytical systems, micro-reactors, MEMs, micro-pumps, molecular diagnostics, DNA separation and analysis, and polymer electrophoresis. CVD coatings are easily patternable, such as through contact or other physical masking techniques. CVD coatings can be utilized in many manufacturing configurations including both batch and roll-to roll deposition systems.

2. Grafting Sites on the Substrate

Because iCVD is a surface controlled process it affords unprecedented opportunity for producing adherent polymer films, including patterned polymer films. Vinyl groups covalently anchored to a surface can react with the initiating species by the same free radical mechanism responsible for polymerization of vinyl monomers, allowing propagation to proceed from the surface bound radical (e.g., covalently bound polymer chains). These grafting sites improve the adhesion for both the directly bound polymer chains, as well as the subsequently deposited chains which can become entangled in the grafted layer or branch out from the grafted chains. Grafting of iCVD polymers, including fluoropolymers and siloxanes, has been described in the literature. Adhesion promotion of iCVD films has been demonstrated with silane coupling agents such as 3-aminopropyldimethylethoxysilane. Grafting and surface promotion/priming agents include but are not limited to silane coupling agents, including but not limited to trichlorovinylsilane, trichlorophenylsilane, 3-aminopropyldimethylethoxysilane, gamma-methacrylosypropyl-trimethoxysilane, and maleic anhydride.

3. Pre- and Post-Processing Steps

Pre- and post-processing steps can be performed in order to maximize barrier coating efficacy.

Pre-processing steps include surface preparation steps including, but not limited to, rinsing the substrate in one or more liquids and/or exposing the substrate to a plasma; pretreatment of the substrate to promote adhesion of the deposited coatings, such as applying or functionalizing the substrate with one or more grafting/priming agents; altering the surface morphology of the substrate; and combinations thereof.

Methods for improving adhesion include but are not limited to treating the substrate with activating plasma to form reactive sites for the grafting of CVD deposited polymer(s) and treating the substrates with a silane or other chemical moiety for the linking of organic and metallic materials. In some embodiments, one or more of the coatings are covalently grafted to the surface of the device or assembly.

Methods for altering the surface morphology of the substrate include, but are not limited to, roughening, polishing, electron bean, IR radiation, gamma radiation, plasma exposure, thermal treatment, or laser exposure.

The substrate can also be treated to alter or modify the surface chemistry. Techniques include, but are not limited to, silane deposition, electron beam, IR radiation, gamma radiation, plasma exposure, thermal treatment, or laser exposure.

Post-processing steps include, but are not limited to, plasma crosslinking of pyrolytic CVD-deposited coatings; post-deposition energetic treatment (annealing, IR, gamma, etc.); post-deposition densification (e.g. radiation hardening; irradiation for cross-linking, "re-reaction"); and combinations thereof. These post processing steps can be used in a similar manner to the pre-processing steps, e.g., modify surface morphology and/or surface chemistry.

In order to maximize ease of deposition and processing, the coating may be formed of graded composition to optimize both bulk and surface properties without the need for multiple coatings. This may be achieved by varying the composition of feed gas to a pyrolytic CVD reactor throughout deposition. In one embodiment the bulk of the coating would be composed of one or more insulating layers followed by the introduction of a monomer containing one or more hydrophobic moieties which would then provide the required low surface energy to the coating as a copolymer with the insulating underlayer. In a further embodiment, the insulating bulk polymer would be a siloxane containing polymer and the surface of the coating would be a copolymer of the same siloxane and a fluorine containing monomer.

4. Monomers

The coatings can be formed using a variety of different monomeric species, such as difluorocarbene, ethylenedioxythiophene, trivinyltrimethylcyclotrisiloxane, hydroxyethylmethacrylate, vinylpyrrolidone, functional acrylates, functional methacrylates, diacrylates, dimethacrylates, and siloxane compounds containing unsaturated organic moieties. Other suitable coating materials include graphene, graphite, molybdenum disulfide, tungsten disulfide, electrically conductive coatings, electrically insulating coatings, and hydrophilic coatings. In other embodiments, one or more of the monomers contain one or more pendant reactive groups, such as epoxy groups.

Exemplary monomers are represented by the structures below:

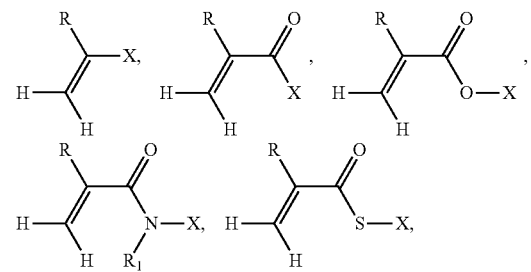

-continued

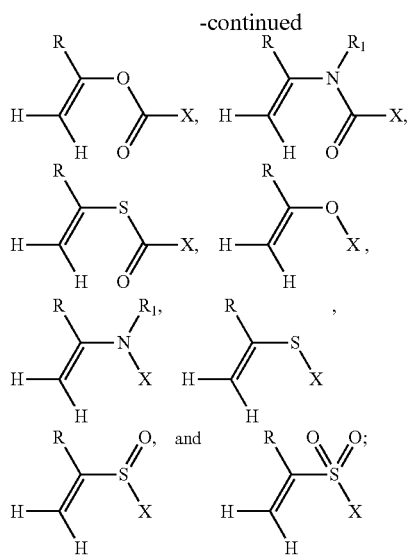

wherein R and $R_1$ are independent selected from hydrogen, alkyl, aralkyl, heteroaralkyl, and carboxyl; halogen (e.g., bromine, chlorine, fluorine, etc.), hydroxyl, alkyoxy, aryloxy, carboxyl, amino, acylamino, amido, carbamoyl, sulfhydryl, sulfonate, and sulfoxido; X is selected from the group consisting of hydrogen, alkyl, cycloalkyl, heteocycloalkyl, aryl, heteroaryl, aralkyl, heteoaralkyl, and $-(CH_2)_nY$, where Y is selected from the group consisting of hydrogen, alkyl, cycloalkyl, heterocycloalkyl, aryl, heteroaryl, aralkyl, heteoaralkyl, nitro, halo, hydroxyl, alkyoxy, aryloxy, carboxyl, heteroaryloxy, amino, acylamino, amido, carbamoyl, sulfhydryl, sulfonate, and sulfoxido; and n is 1-10 inclusive.

In some embodiments, R is hydrogen or methyl, X is hydrogen or $-(CH_2)_nY$, where Y is alkyl, cycloalkyl, heterocycloalkyl, aryl, nitro, halo, hydroxyl, alkyloxy, aryloxy, amino, acylamino, amido, or carbamoyl, and n is 3-8 inclusive. In other embodiments, R, X and n are as defined above and Y is hydrogen, heterocyloalkyl, or oxirane.

In other embodiments, the monomer is selected from $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF.sub.3 COOH$, difluorohalomethanes such as $CF_2Br_2$, $CF_2HBr$, $CF_2HCl$, $CF_2Cl_2$, and $CF_2FCl$; difluorocyclopropanes such as $C_3F_6$, $C_3F_4H_2$, $C_3F_2Cl_4$, $C_2F_3Cl_3$, and $C_3F_4Cl_2$; trifluoromethylfluorophosphanes such as $(CF_3)_3PF_3$, $(CF_3)_2PF_3$, and $(CF_3)PF_4$; or trifluoromethylphosphino compounds such as $(CF_3)_3P$, $(CF_3)_2P-P(CF_3)_2(CF_3)_2PX$, and $CF_3PX_2$, where X is F, Cl, or H. Other monomers can also be employed.

i. Fluorinated Monomers

CVD techniques, such as iCVD, can be used to polymerize fluorinated monomers containing vinyl bonds. Fluoropolymers, if they can be dissolved at all, require the use of harsh solvents for liquid-base film casting process. Vapor-based processes avoid the difficulties resulting from surface tension and nonwetting effects, allowing ultrathin films (<10 nm) to be applied to virtually any substrate. Thus, iCVD is highly suitable for the deposition of fluoropolymers. Suitable fluorinated monomers include, but are not limited to, perfluoroalkylethyl methacrylate $(CH_2=C(CH_3)COOCH_2CH_2-(CF_2)_nCF_3$, perfluoroalkyl acrylates $(CH_2=CHCOOCH_2CH_2(CF_2)_7-CF_3)$, perfluoroalkenes $(CF_2=CF-(CF_2)_n-CF_3)$ where n=5-13, and fluorinated propylene oxides, such as hexafluoropropylene oxide (HFPO).

In addition to homopolymers, iCVD copolymers of one or more fluorinated monomers with other monovinyl, divinyl, trivinyl, and cyclic monomers can be used to tune surface energy, surface roughness, degree of crystallinity, thermal stability, and mechanical properties. Control over surface properties is critical for electrowetting applications, since the surface energy and roughness directly determine the contact angles achieved with liquids and hysteresis between the advancing and receding angles. By reducing crystallinity, copolymerization reduces the probability the formation of pinholes resulting from the incomplete surface coverage that occurs when two or more crystallite domains meet. Pin-hole free films are required for the dielectric layer. Thermal, e-beam, or UV post-treatments can alter the surface properties of the iCVD layer, leading to changes in the observed contact angles and hysteresis behavior.

ii. Polysiloxane Coatings

CVD techniques, such as iCVD, can also be used to prepare polysiloxane ("silicone") coatings formed from siloxane-containing monomers including, but not limited to, vinyl siloxane monomers, such as trivinyl-trimethyl-cyclotrisiloxane (V3D3) The resulting material [poly(V3D3)] is a highly cross-linked matrix of silicone and hydrocarbon chemistries. The dense networked structure renders this material more resistant to swelling and dissolution compared with coatings having little or no crosslinking, such as conventional silicones or parylene.

In some embodiments, the polymer contains both fluorine and siloxane moieties. For example, in particular embodiments, the coating contains a polymer containing siloxane moieties terminated by fluorine containing groups. In one embodiment, the siloxane containing polymer is poly(trivinyl-trimethyl-cyclotrisiloxane) and the fluorine containing termination groups are composed of fragments of perfluorobutane sulfonate.

5. Initiators

In certain embodiments, when a gaseous initiator is utilized, the gaseous initiator is selected from the group consisting of compounds of Formula I:

A-X—B     (Formula I)

wherein, independently for each occurrence, A is hydrogen, alkyl, cycloalkyl, aryl, heteroaryl, aralkyl or heteroaralkyl; X is —O—O— or —N=N—; and B is hydrogen, alkyl, cycloalkyl, aryl, heteroaryl, aralkyl or heteroaralkyl.

In certain embodiments, the gaseous initiator is a compound of formula I, wherein A is alkyl.

In certain embodiments, the gaseous initiator is a compound of formula I, wherein A is hydrogen.

In certain embodiments, the gaseous initiator is a compound of formula I, wherein B is alkyl.

In certain embodiments, the gaseous initiator is a compound of formula I, wherein X is —O—O—.

In certain embodiments, the gaseous initiator is a compound of formula I, wherein X is —N=N—.

In certain embodiments, the gaseous initiator is a compound of formula I, wherein A is —C(CH$_3$)$_3$; and B is —C(CH$_3$)$_3$. In certain embodiments, the gaseous initiator of the invention is a compound of formula I, wherein A is —C(CH$_3$)$_3$; X is —O—O—; and B is —C(CH$_3$)$_3$.

In certain embodiments, the gaseous initiator is selected from the group consisting of hydrogen peroxide, alkyl or aryl peroxides (e.g., tert-butyl peroxide), hydroperoxides, halogens and nonoxidizing initiators, such as azo compounds (e.g., bis(1,1-dimethyl)diazene).

Note that "gaseous" initiator encompasses initiators which may be liquids or solids at standard temperature and pressure (STP), but upon heating may be vaporized and fed into the chemical vapor deposition reactor.

6. End-Capped Polymers

For some applications, it may be desirable to form polymer coatings in order to reduce the likelihood that the polymer reacts with moisture in the surrounding environment. Conventional HFCVD methods of forming polymer coatings do not include a polymer chain termination step. As a result, reactive groups are retained at the end of each polymer chain. On exposure to the atmosphere, such groups can react with ambient oxygen and/or moisture, forming polar end groups (e.g., carboxylic acids, sulfonic acids, hydroxyl groups, amines, etc.) on the polymer chains, reducing the lubricity of the coating. Polar end groups may also increase the surface energy of the coating and compromise other desirable properties such as hydrophobicity.

To prevent the formation of polar end groups, a method of forming an end-capped polymer coating on an article is disclosed including the steps of (1) evacuating a vacuum chamber, (2) introducing a precursor gas and a fluorocarbon gas into the vacuum chamber, (4) directing the precursor gas and the fluorocarbon gas into the vicinity of one or more heated filaments, thereby activating the one or more gases, and (5) forming an end-capped polymer coating on the article.

In a related embodiment, to prevent the formation of polar end groups, a method of forming an end-capped polymer coating on an article is disclosed including the steps of (1) evacuating a vacuum chamber, (2) introducing a precursor gas into the vacuum chamber, at or below atmospheric pressure (3) directing the precursor gas into the vicinity of an energy source, thereby activating the precursor gas, (4) forming a polymer coating on the article, (5) ceasing flow of the precursor gas and commencing flow of a fluorocarbon gas and, (6) directing the fluorocarbon gas into the vicinity of an energy source, thereby activating the fluorocarbon gas, and (7) terminating the polymer chains of the coating with activated fragments of the fluorocarbon gas.

The sequential method described above permits the use of a variety of energy sources to activate the gases, including, but not limited to, one or more heated filaments, ionic plasma, pulsed plasma, UV irradiation, or gamma irradiation.

The backbone of the polymer chains in the polymer coating is formed from the precursor gas. The precursor gas may be, for example, hexafluoropropylene oxide (HFPO). The polymer chains thus formed may be terminated ("end-capped") by a fluorocarbon gas. The fluorocarbon gas may be, for example, hexafluoroethane. In this case, homolysis of hexafluoroethane produces trifluoromethyl radicals, which react with the reactive ends of the PTFE chains formed from HFPO, yielding PTFE terminated by non-polar trifluoromethyl groups.

The degree of end-capping can be controlled by varying the amount of gas introduced into the chamber. In one embodiment, the percent of end groups that are end-capped is at least 5%, 10%, 15%, 20%, 25%, 30%, 35%, 40%, 45%, 50%, 55%, 60%, 65%, 70%, 75%, 80%, 85%, 90%, or 95%. In a particular embodiment, the percent of end groups that are end-capped is greater than 40% preferably greater than 50%, more preferably greater than 70%.

In some embodiments, device or assembly contains a final surface layer of a hydrophobic polymer coating which is end-capped with a highly hydrophobic molecule containing at least one $CF_3$ moiety in order to decrease the surface energy of the surface.

In still other embodiments, the hydrophobic polymer layer is end-capped throughout its deposition, not only at the surface.

7. Porosity

In some embodiments, the polymer coating contains nano- or microporosity. The size and density of this porosity may be varied through control of the pyrolytic CVD conditions (such as pressure, filament temperature, substrate temperature, monomer to initiator ratio, and residence time). Porosity is also controlled through selection of monomer or monomers and optionally free radical initiator. Porous vapor deposited coatings may be deposited as thin as a few nanometers and up to 10s of microns thick.

The pores can be backfilled or impregnated with one or more materials to modify the properties of the coatings. In one embodiment, the pores are back filed with one or more additional vapor deposited polymers and can be deposited using techniques known in the art, such as those discussed above. In one embodiment the porous polymer would be PTFE and the backfilling polymer is a parylene derivative or siloxane containing polymer.

In another embodiment, the pores of the nano/microstructured vapor deposited polymer coating are impregnated with a lubricating oil to generate low contact angle hysteresis. Contact Angle Hysteresis is defined as the difference between advancing and receding contact angles. This hysteresis occurs due to the wide range of "metastable" states which can be observed as the liquid meniscus scans the surface of a solid at the solid/liquid/vapor interface. In some embodiments, the coating exhibits a contact angle hysteresis value less than 20°, 15°, 10°, 7°, 5°, 4°, 3°, or 2°.

For example, a porous 50 nm iCVD PTFE coating, impregnated with a low surface tension oil (e.g., Krytox oil), resulted in water contact angle hysteresis values as low as 2°. This can be useful in a variety of applications, including electrowetting devices, where thin coatings exhibiting both hydrophobicity and low contact angle hysteresis are important in achieving maximum droplet modulation or motion.

Oil may be infused in the coating through dip, spray, or spin-on methodologies. The application of heat may also be helpful in infusing the oil into the pores of the coating. Once infused, the oil/coating combination may be extremely stable, even in the presence of surfactants or other oils. For example, the 50 nm iCVP PTFE film infused with Krytox oil, discussed above, exhibited no change in surface properties even after 60 minutes of sonication in a 1% surfactant solution (dawn liquid, branson cleaner).

8. Additional Barrier Materials

Additional barrier materials can be used in combination with the iCVD deposited coatings. Exemplary additional barrier materials which may be utilized in combination with pyrolytic CVD coatings, or copolymerized with them include, but are not limited to, COC (cyclic olefin copolymer); polypropylene; polyurethane; PVC; PET; epoxy; polycarbonate; and combinations thereof.

III. Electrowetting and Electrofluidic Devices

Electrowetting and electrofluidic devices, which have been coated with one or more vapor-deposited materials, are described herein. The device can be coated using one or more of the techniques discussed above. In some embodiments, electrode surfaces of the electrowetting and/or electrofluidic devices are coated. In some embodiments, the electrodes are non-planar.

The devices or assemblies can contain an electronic device or an optoelectronic device, such as a display or lens. In some embodiments, the device is a display, lens, microlens, medical diagnostic device, fiber optic, micro-mirror, waveguide, ink jet printing device, fuel cell, or microfluidic device, such as fluidic control device, energy management device, or heat-management device. In still other embodiments, the microfluidic device is utilized for protein crystallization, analytic chemistry, proteomics, micropumping, forensics, molecular diagnostics, separations, or other lab-on-a-chip applications.

In some embodiments, the device is an electrofluidic device, such as a lab-on-a-chip device, suitable for carrying out immunoassays, PCR, and/or clinical chemistry. In still other embodiments, the device is a liquid crystal display or contains a liquid crystal polymer layer.

A. Coated Devices and Their Properties

In some embodiments, the coating on the device contains two layers, an insulating dielectric layer beneath a highly hydrophobic outer layer, e.g., static contact angle with water greater than 120° in air. In other embodiments, the coating contains a single layer which possesses both dielectric stability and hydrophobicity.

In some embodiments, the dielectric layer is polymeric, such as a homopolymer or copolymer. Suitable polymers include, but are not limited to, vinyl siloxane, PTFE, a fluorinated acrylate or methacrylates, divinylsiloxane-bis-benzocyclobutene (DVS-BCB), parylene, or divinyl benzene. In some embodiments, the dielectric layer is polymeric as described above and the hydrophobic layer is a fluorine containing polymer, such as PTFE.

In still other embodiments, the coating contains a single layer which possesses both dielectric stability and hydrophobicity, such as a polymer containing both fluorine and siloxane moieties. Examples include polymers containing siloxane moieties which are terminated by fluorine containing groups (e.g., perfluorobutane sulfonate).

In some embodiments, the coating is well adhered to the substrate as defined by ASTM D3359.

In some embodiments, the vapor-deposited coating(s) afford a static contact angle of >100° with respect to water when no electrical bias is present and a static contact angle of <20°, <15°, <10°, <5°, 0° with respect to water under electrical bias.

In some embodiments, the advancing and receding contact angles of the coated devices vary by no more than 30°, 20°, 10°, or 5° with respect to water. In some embodiments, the advancing and receding contact angles of the coated devices vary by no more than 30°, 20°, 10°, or 5° with respect to hexadecane.

In some embodiments, an electrical bias of no greater than 25V, 20V, or 15V is required to impart a reduction of >100°, >80°, >60° in the static contact angle of water on the coating.

In some embodiments, the static contact angle with respect to water is varied by varying the surface morphology of the coating. The variation in surface morphology can be imparted through variation of coating deposition process conditions, such as vapor residence time, reactor temperature, reactor pressure, substrate temperature, filament temperature, filament composition, monomer concentration, inert gas concentration, substrate position within the reactor, comonomer concentration, and combinations thereof. In other embodiments, the surface morphology is altered through processing of the coating subsequent to deposition, such as by UV, thermal, corona discharge, e-beam, gamma radiation, ionic plasma, IR radiation, and mechanical patterning or abrasion.

CVD can be used to apply thin, uniform coatings to a variety of substrates used to prepare electrowetting and/or electrofluidic devices. Typical thicknessess are less than 1000 nm, 750 nm, 500 nm, 250 nm, 100 nm, 50 nm, 25, nm, 10 nm, or 5 nm. In some embodiments, the device or assembly is coated conformally with less than 50%, 40%, 30%, 20%, 10%, 5%, or 1% variation in coating thickness over microfeatures on the device or assembly surface. In other embodiments, the coating forms a conformal and substantially pin-hole free layer at a thickness of about 500 nm, 250 nm, 100 nm, 50 nm, 25 nm, 10 nm, or 5 nm.

In some embodiments, the coating resists ion ingress from a covering fluid while under active bias and maintains required dielectric properties for greater than 1 month, 45 days, 2 months, 75 days, 3 months, 4 months, 5 months, 6 months, 1 year, 2 years, 3 years, 5 years, 10 years, or 25 years.

The coated devices describes herein are designed to operate relatively low voltages for a given pair of hydrophilic/hydrophobic fluids. In some embodiments, the voltage is less 20, 19, 18, 17, 16, 15, 14, 13, 12, 11, or 10 volts.

The coated devices described herein can exhibit one or more of the properties discussed above.

B. Comparison of Fluoropolymer and Siloxane Coated Devices to Parylene Coated Devices Fluoropolymer (e.g., PTFE) and polysiloxane (e.g., poly (V3D3)) coatings succeed in providing environmental protection against ingress of water and other contaminants under harsh conditions at high electric fields. Moreover, these coatings significantly outperform parylene coatings, the incumbent dielectric material for electrowetting devices.

During preliminary accelerated degradation testing at high temperature, high humidity, and electrically-biased conditions, interdigitated electrodes (IDEs) coated with polymers coatings applied using iCVD, at coating thicknesses of as low as 750 nm, significantly outperform parylene-C coated IDEs even at parylene thicknesses of 6 to 15 μm. Parylene-coated IDEs exhibited excessive leakage currents. Preliminary electrowetting testing showed excellent performance results for 1 μm poly(V3D3)/50 nm PTFE coatings. iCVD poly(V3D3)/PTFE samples tested show as high as 100° to 108° contact angle modulation (+DC and 1 kHz AC conditions). iCVD poly(V3D3) samples with a ~50 nm wet-applied Fluoropel topcoat showed as high as 113° contact angle modulation.

The hydrolytic and solvent stability of poly(V3D3) was also investigated. One notable feature of this material is its excellent adhesion to a variety of substrates—a critical requirement for long-term stability. Poly(V3D3) coatings retain adhesivity (exhibits 0% delamination during ASTM 3359 tape test) after exposure to a variety of solvents and after boiling in water. iCVD silicone coatings have survived under combined physiological saline soak and DC electrical bias for >6 years. Samples were held at sweeping bias of +5V to −5V under immersion in Ringer's solution (a biomedical saline solution). The samples were mounted within custom-designed tubes with electrical contacts. The data demonstrated the remarkable long-term insulation characteristics of poly(V3D3). The coatings maintain resistances $\geq 10^{12}$ ohms, demonstrating their resistance to liquid water and ion penetration. No coating cracks, pinholes, or other failure manifestations developed over this time period.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A method for coating an electrowetting or electrofluidic device or assembly substrate with one or more coatings, the method comprising directing one or more gaseous precursors into a chamber under vacuum containing the device or assembly substrate to be coated and activating the one or more gaseous precursors with an energy source to coat the device or assembly substrate, wherein at least one of the coatings provides insulation, and/or low surface energy, or both;
   wherein the one or more gaseous precursors comprise reactive monomers and the reactive monomers are fluorinated unsaturated compounds,
   wherein at least one of the one or more coatings is porous, and wherein the method further comprises backfilling by infusing the at least one of the porous coatings with one or more oils.

2. The method of claim 1, wherein the fluorinated unsaturated compounds are selected from the group consisting of fluorinated acrylate, fluorinated methacrylate, fluorinated methyl methacrylate, fluorinated alkenes, fluorinated perfluoroalkylethyl methacrylate, fluorinated alkylethylacrylate, fluorinated propylene oxide, and combinations thereof.

3. The method of claim 1, wherein the one or more coatings are deposited continuously or semi-continuously on the device or assembly substrate.

4. The method of claim 1, wherein the device or assembly substrate is a flexible substrate spooled between two rolls.

5. The method of claim 1, wherein the one or more coatings are formed by initiated chemical vapor deposition (iCVD).

6. The method of claim 1, wherein the one or more coating's chemical composition is varied over its thickness.

7. The method of claim 1, wherein the device or assembly substrate is treated prior to coating application, wherein the treatment is selected from the group consisting of roughening, polishing, electron beam, IR radiation, gamma radiation, plasma exposure, thermal treatment, and laser exposure.

8. The method of claim 1, wherein the device or assembly substrate is treated prior to coating application, wherein the treatment is selected from the group consisting of silane deposition, electron beam, IR radiation, gamma radiation, plasma exposure, thermal treatment, and laser exposure.

9. The method of claim 1, wherein the one or more coatings comprise an amorphous fluoropolymer.

10. The method of claim 9, wherein the at least one porous coating is composed of polytetrafluoroethylene.

11. The method of claim 1, wherein at least one of the one or more coatings is a hydrophobic polymer coating.

12. The method of claim 1, wherein the one or more coatings is covalently grafted to the device or assembly substrate.

13. The method of claim 1, wherein the one or more coatings are comprised of two layers, an insulating dielectric layer beneath a hydrophobic outer layer.

14. The coating of claim 13, wherein the hydrophobic layer is poly(ethene-co-tetrafluoroethene), fluorinated ethylene propylene, perfluoroalkoxy alkanes, 1H,1H,2H,2H-perfluorodecylacrylate, or copolymers of terafluoroethylene and 2,2-bis(trifluoromethyl)-4,5-difluoro-1,3-dioxole.

15. The method of claim 1, wherein the one or more coatings are deposited by plasma chemical vapor deposition (CVD).

16. The method of claim 1, wherein the one or more coatings are deposited in multiple layers.

17. The method of claim 1, wherein the device or assembly substrate is held above room temperature during coating or below room temperature during coating.

18. The method of claim 1, wherein the one or more coatings are patterned through contact or other physical masking.

19. The method of claim 1, wherein the device or assembly substrate is treated after coating, wherein the treatment is selected from the group consisting of roughening, polishing, electron beam, IR radiation, gamma radiation, plasma exposure, thermal treatment, and laser exposure.

20. The method of claim 1, wherein the device or assembly substrate is treated after coating application, wherein the treatment is selected from the group consisting of silane deposition, electron beam, IR radiation, gamma radiation, plasma exposure, thermal treatment, and laser exposure.

21. The method of claim 1, further comprising directing one or more gaseous initiators into the chamber under vacuum containing the device or assembly substrate to be coated and activating the one or more initiators with the energy source.

* * * * *